United States Patent
Le Tual et al.

(10) Patent No.: US 8,514,123 B2
(45) Date of Patent: Aug. 20, 2013

(54) COMPACT SAR ADC

(75) Inventors: Stéphane Le Tual, St-Egreve (FR);
Mounir Boulemnakher, Grenoble (FR);
Pratap Narayan Singh, Varanasi (IN)

(73) Assignee: STMicroelectronics S.A., Montrouge (FR)

( * ) Notice: Subject to any disclaimer, the term of this patent is extended or adjusted under 35 U.S.C. 154(b) by 80 days.

(21) Appl. No.: 13/247,001

(22) Filed: Sep. 28, 2011

(65) Prior Publication Data

US 2012/0112948 A1 May 10, 2012

(30) Foreign Application Priority Data

Sep. 28, 2010 (FR) ...................... 10 57815

(51) Int. Cl.
*H03M 1/34* (2006.01)
(52) U.S. Cl.
USPC .......................... 341/163; 341/155
(58) Field of Classification Search
USPC .................. 341/172, 155, 144, 163
See application file for complete search history.

(56) References Cited

U.S. PATENT DOCUMENTS

| | | | |
|---|---|---|---|
| 6,538,594 B1 | 3/2003 | Somayajula | |
| 7,167,121 B2 * | 1/2007 | Carreau et al. | 341/150 |
| 7,456,768 B2 * | 11/2008 | La Rue et al. | 341/141 |
| 7,675,452 B2 * | 3/2010 | Madhavan et al. | 341/162 |
| 7,705,755 B2 * | 4/2010 | Yang et al. | 341/120 |
| 8,390,501 B2 * | 3/2013 | Chang et al. | 341/163 |
| 2010/0090873 A1 | 4/2010 | Yang | |
| 2010/0141499 A1 | 6/2010 | Mathe | |
| 2012/0274488 A1 * | 11/2012 | Kapusta | 341/110 |

OTHER PUBLICATIONS

French Search Report dated Apr. 18, 2011 from corresponding French Application No. 10/57815.
Writtn Opinion dated Apr. 21, 2011 from corresponding French Application No. 10/57815.

* cited by examiner

*Primary Examiner* — Peguy Jean Pierre
(74) *Attorney, Agent, or Firm* — Wolf, Greenfield & Sacks, P.C.

(57) ABSTRACT

A method of successive approximation analog to digital conversion including: during a sample phase, coupling an input signal to a plurality of pairs of capacitors; and during a conversion phase, coupling a first capacitor of each pair to a first supply voltage, and a second capacitor of each pair to a second supply voltage.

26 Claims, 4 Drawing Sheets

COMPACT SAR ADC

CROSS REFERENCE TO RELATED APPLICATIONS

This application claims the priority benefit of French patent application number 10/57815., filed on Sep. 28 2010, entitled COMPACT SAR ADC, which is hereby incorporated by reference to the maximum extent allowable by law.

BACKGROUND OF THE INVENTION

1. Field of the Invention

The present invention relates to a successive approximation register (SAR) analog to digital converter (ADC). In particular, the present invention relates to a SAR ADC and a method of performing successive approximation for analog to digital conversion based on a capacitor array.

2. Discussion of the Related Art

SAR ADC converters generally comprise one or more n-bit converters that operate in parallel. Each n-bit converter is arranged to sample an input voltage, and generates an n-bit digital value corresponding to the amplitude of the input voltage.

Generating the n-bit digital value generally involves sampling the input signal by a set of capacitors having binary weighted capacitance values corresponding to the most significant to least significant bits of the n-bit output signal. The capacitors are coupled to an input of a comparator, and a reference voltage is supplied to the other input of the comparator. A trial and error process is then used to determine what combination of high and low voltages coupled to each capacitor in turn balances the comparator.

In certain applications, such as mobile device applications, it is desirable to minimize the surface area of SAR ADCs, without compromising the accuracy of the device. There is thus a need for an improved SAR ADC having high accuracy and a reduced surface area and complexity.

SUMMARY OF THE INVENTION

Embodiments aim to at least partially overcome one or more needs in the prior art.

According to one embodiment, there is provided a method of successive approximation analog to digital conversion comprising: during a sample phase, coupling an input signal to a plurality of pairs of capacitors, first and second capacitors of each pair of capacitors being coupled to a first input of a comparator; and during a conversion phase, coupling the first capacitor of each pair of capacitors to a first supply voltage, and the second capacitor of each pair of capacitors to a second supply voltage.

According to one embodiment, the first capacitor of each pair of capacitors has the same capacitance as the second capacitor of each pair.

According to another embodiment, the first and second capacitors of at least one of said pairs of capacitors have different capacitances from each other.

According to another embodiment, the method further comprises, after coupling the first and second capacitors to said first and second supply voltages respectively, comparing by said comparator the voltage at said first input with a further voltage level, and based on said comparison either coupling the first capacitor of a first of said pairs of capacitors to said second supply voltage, or coupling the second capacitor of the first of said pairs of capacitors to said first supply voltage.

According to another embodiment, said further voltage level is a reference voltage level.

According to another embodiment, said further voltage level is a voltage level generated a by a further plurality of pairs of capacitors.

According to another embodiment, the method further comprises, during said sample phase, coupling a further input signal to said further plurality of pairs of capacitors; and during said conversion phase, coupling a first capacitor of each pair of said further plurality of capacitors to said first supply voltage, and coupling a second capacitor of each pair of said further plurality of capacitors to said second supply voltage.

According to another embodiment, said first and second capacitors of each further pair of capacitors are coupled to a second input of a comparator, the method comprising, based on said comparison, coupling the first capacitor of a first of said pairs of capacitors to said second supply voltage and a second capacitor of a first of said further pairs of capacitors to said first supply voltage, or coupling the second capacitor of the first of said pairs of capacitors to said first supply voltage and the first capacitor of the first of said further pairs of capacitors to said second supply voltage.

According to another embodiment, said first capacitor of said first of said pairs of capacitors has a larger capacitance than said second capacitor of said first of said pairs of capacitors, and said first capacitor of said first of said further pairs of capacitors is has a larger capacitance than said second capacitor of said first of said further pairs of capacitors.

According to another embodiment, during said sampling phase, said input signal is applied to a first terminal of each of said plurality of pairs of capacitors, and a third supply voltage (Vs) is applied to a second terminal of each of said plurality of pairs of capacitors.

According to a further embodiment, there is provided a successive approximation analog to digital converter comprising: a comparator; a plurality of pairs of capacitors, each capacitor of the plurality of pairs of capacitors being coupled between a corresponding switch and a first input terminal of the comparator, and each being arranged to receive an input voltage during a sample phase of the converter; and control circuitry arranged to control, at the start of a conversion phase of said converter, said switches such that a first capacitor of each pair of capacitors is coupled to a first supply voltage, and a second capacitor of each of said pairs of capacitors is coupled to a second supply voltage.

According to one embodiment, the SAR ADC further comprises: a further plurality of pairs of capacitors each coupled between a corresponding switch and a further input terminal of the comparator, and each further pair of capacitors being arranged to receive a further input voltage during said sample phase; wherein said control circuitry is further arranged to control, at the start of said conversion phase of said converter, said switches such that a first capacitor of each pair of capacitors is coupled to a first supply voltage, and a second capacitor of each of said pairs of capacitors is coupled to a second supply voltage.

According to another embodiment, said first capacitor of at least one of said pairs of capacitors has a different capacitance to said second capacitor of said at least one pair.

According to a further embodiment, there is provided an electronic device comprising a plurality of the above SAR ADCs arranged in parallel to convert an input voltage.

BRIEF DESCRIPTION OF THE DRAWINGS

The foregoing and other purposes, features, aspects and advantages will become apparent from the following detailed description of embodiments, given by way of illustration and not limitation with reference to the accompanying drawings, in which.

DETAILED DESCRIPTION

Figure 1:
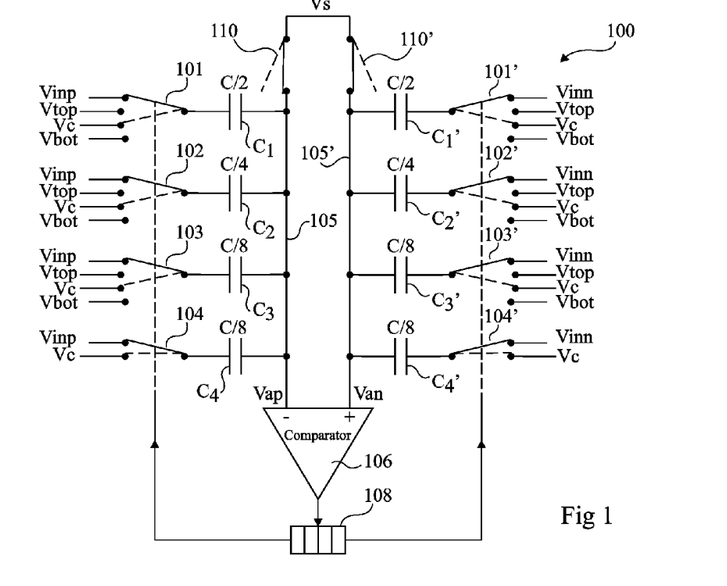
FIG. 1 illustrates an example of a SAR ADC.

FIG. 1 illustrates an example of a 4-bit differential SAR ADC 100 as described in co-pending non-published French patent application N° FR10/55050 filed on Jun. 24, 2010. A left-hand side of the converter 100 comprises four capacitors $C_1$ to $C_4$, having respective capacitance values C/2, C/4, C/8 and C/8. These capacitors are coupled on one side to switches 101 to 104 respectively. Similarly, a right-hand side of the converter 100 comprises capacitors $C_1'$ to $C_4'$, also having capacitance values C/2, C/4, C/8 and C/8 respectively, and which are respectively coupled to switches 101' to 104'. The other sides of capacitors $C_1$ to $C_4$ and $C_1'$ to $C_4'$ are coupled to nodes 105 and 105' respectively, which are in turn coupled to the negative and positive inputs respectively of a comparator 106. The output of comparator 106 is coupled to a 4-bit register 108 for storing the result of the comparison. Nodes 105 and 105' are also coupled to a supply voltage Vs via switches 110 and 110' respectively.

In the example of FIG. 1, the switches 101 to 103 and 101' to 103' allow the corresponding capacitors to be connected to one of: the input voltage Vinp or Vinn; a high supply voltage Vtop; a low supply voltage Vbot; and a supply voltage Vc. Furthermore, switch 104 of FIG. 1 allows the final capacitor $C_4$ to be coupled to input voltage Vinp or to the supply voltage Vc. Likewise, switch 104' of FIG. 1 allows the final capacitor $C_4'$ to be coupled to input voltage Vinn or to the supply voltage Vc.

The voltage Vc is a voltage level for example between Vtop and Vbot, and for example at the mid-point between these supply voltages. For example, assuming Vtop is equal to 0.5 V and that Vbot is equal to 0 V, Vc could equal 0.25 V, or a different value, such as 0.4 V.

Figure 2:
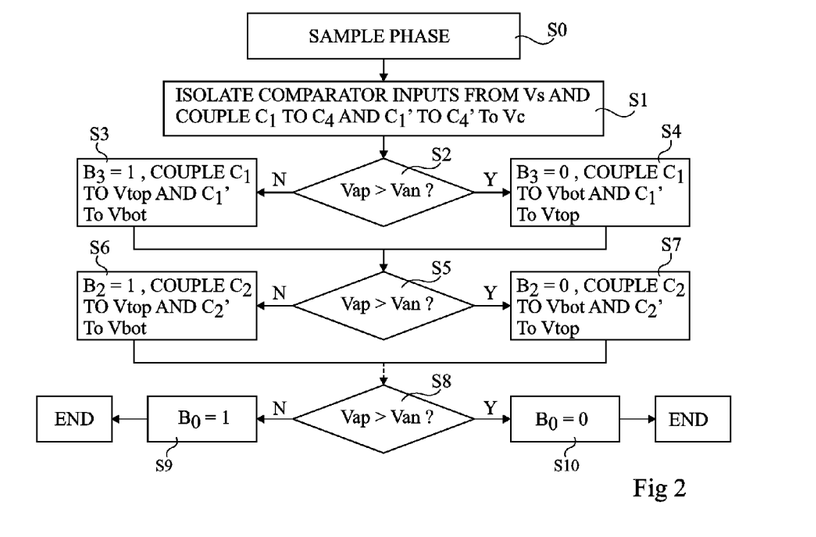
FIG. 2 is a flow diagram showing an example of steps for performing analog to digital conversion based on the circuit of FIG. 1.

The operation of the circuit 100 of FIG. 1 will now be described with reference to the flow diagram of FIG. 2. The 4 bits of the output of the comparator will be referred to as $B_3$ to $B_0$, where $B_3$ is the most significant bit (MSB).

In a first step S0, a sample phase is performed, in which the nodes 105 and 105' are coupled to the supply voltage Vs via switches 110 and 110', and at the same time each of the switches 101 to 104 is coupled to the input voltage Vinp, and each of the switches 101' to 104' is coupled to the input voltage Vinn. This connection state is shown by a solid line in each switch of FIG. 1.

Next, in step S1, the comparator inputs are isolated from supply voltage Vs by opening switches 110 and 110', and the capacitors $C_1$ to $C_4$ and $C_1'$ to $C_4'$ are all coupled to supply voltage Vc. This configuration is shown by a dashed line in each switch of FIG. 1.

In a next step S2, the comparator determines whether voltage Vap at node 105 is greater than voltage Van at node 105'.

Initially Vap=Vs+(Vc−Vinp), while Van=Vs−(Vinn−Vc), and thus Vap−Van=−(Vinp−Vinn), and so the comparison of Vap and Van is equivalent to a comparison between Vinp and Vinn.

If it is determined in S2 that Vap is less than Van, then the next step is S3, in which the MSB $B_3$ of the 4-bit output is set to "1", and switches 101 and 101' are switched such that capacitor $C_1$ is coupled to Vtop, and capacitor $C_1'$ is coupled to Vbot.

Alternatively, if it is determined in S2 that Vap is greater than Van, then the next step is S4, in which the MSB $B_3$ of the 4-bit output is set to "0", and switches 101 and 101' are switched such that capacitor $C_1$ is coupled to Vbot, and capacitor $C_1'$ is coupled to Vtop.

After steps S3 and S4, the next step is S5, in which again Vap and Van are compared by the comparator. Now however capacitors $C_1$ and $C_1'$ have been coupled to one of the supply voltages Vtop and Vbot. If $C_1$ was coupled to Vtop and $C_1'$ was coupled to Vbot in step S3, due to the binary weighting of capacitor $C_1$ in the capacitor array, Vap becomes equal to Vs+(Vc−Vinp)+(Vtop−Vc)/2, while Van becomes equal to Vs+(Vc−Vinn)−(Vc−Vbot)/2. Thus Vap−Van is equal to −(Vinp−Vinn)+(Vtop−Vbot)/2. Alternatively, if $C_1$ was coupled to Vbot and $C_1'$ to Vtop in step S4, Vap−Van is equal to −(Vinp−Vinn)−(Vtop−Vbot)/2.

If it is determined in S5 that Vap is less than Van, the next step is S6, in which bit $B_2$ is set equal to "1", capacitor $C_2$ is coupled to Vtop, and capacitor $C_2'$ is coupled to Vbot.

Alternatively, if it is determined in S5 that Vap is greater than Van, the next step is S7, in which bit $B_2$ is set equal to "0", capacitor $C_2$ is coupled to Vbot, and capacitor $C_2'$ is coupled to Vtop.

After steps S6 and S7, the method continues by comparing again Vap and Van based on the new connections of the capacitors $C_2$ and $C_2'$, but this step and subsequent switching steps of $C_3$ and $C_3'$ are not illustrated for the sake of brevity. Instead, the illustrated method goes straight to a step S8, once each of the switches 101 to 103 and 101' to 103' has been connected to either Vtop or Vbot.

In step S8, the least significant bit $B_0$ of the output value is determined, based on a comparison of Vap and Van.

If in S8 it is determined that Vap is less than Van, the next step is S9, in which $B_0$ is set to "1".

Alternatively, if in S8 it is determined that Vap is greater than Van, the next step is S10, in which $B_0$ is set to "0".

Capacitors $C_4$ and $C_4'$, which remain coupled to Vc throughout the voltage conversion process, can be omitted in alternative embodiments. The purpose of these capacitors is to bring the total capacitance to C, which results in a unity gain converter. Otherwise, gain is equal to $1-\frac{1}{2}^N$, where N is the number of bits.

Thus in the conversion process of FIG. 1, the bit decisions are made using one step, by a single switching operation after each comparison. Thus, the current drawn from the supplies is advantageously the same for each of the corresponding decisions of each bit, and relaxes dynamic constraints on the supply voltages Vtop and Vbot.

It would be desirable to remove the need of supplying the additional supply voltage Vc to each of the switches of FIG. 1, while maintaining the advantages in terms of supply current uniformity as a function of the input voltage.

Figure 3:
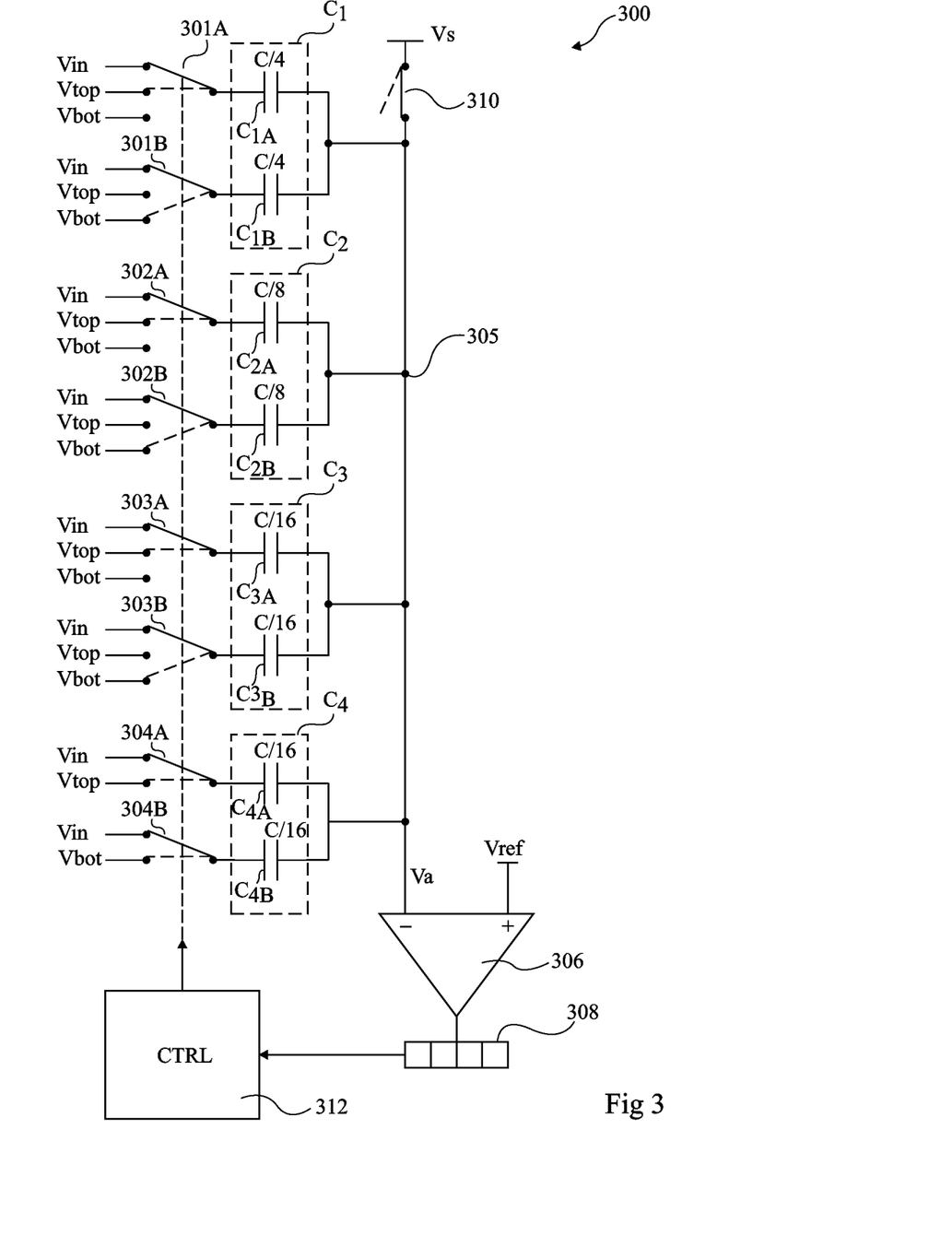
FIG. 3 illustrates a SAR ADC according to an embodiment.

FIG. 3 illustrates an alternative embodiment of an SAR ADC 300, which is a single-ended converter rather that a differential converter, having functionality similar to that of the left-hand side of the converter 100 of FIG. 1. The right-hand side of the converter is replaced by a reference voltage Vref.

Each of the capacitors $C_1$ to $C_4$ of the left-hand portion of the converter 100 of FIG. 1 is implemented in the embodiment of FIG. 3 by a pair of parallel capacitors. In particular, the capacitor $C_1$ comprises a pair of capacitors $C_{1A}$ and $C_{1B}$, the capacitor $C_2$ comprises a pair of capacitors $C_{2A}$ and $C_{2B}$, the capacitor $C_3$ comprises a pair of capacitors $C_{3A}$ and C3B, and the capacitor $C_4$ comprises a pair of capacitors $C_{4A}$ and $C_{4B}$.

Each capacitor of each pair of capacitors is preferably of equal capacitance, preferably equal to half the capacitance of the corresponding capacitor $C_1$ to $C_4$ in FIG. 1. Thus, for example, the capacitor $C_1$ in FIG. 1 has a capacitance of C/2, while the capacitors $C_{1A}$ and $C_{1B}$ each have a capacitance of C/4.

The converter 300 further comprises switches 301A, 302A, 303A and 304A, each of which is coupled to the corresponding capacitor $C_{1A}$ to $C_{4A}$, and switches 301B, 302B, 303B and 304B, each of which is coupled to the corresponding capacitor $C_{1B}$ to $C_{4B}$. Each of the switches 301A to 303A and 301B to 303B allows either the input voltage Vin, the high supply voltage Vtop or the low supply voltage Vbot to be coupled to the corresponding capacitor. The switch 304A allows either the input voltage Vin or the high supply voltage Vtop to be coupled to capacitor $C_{4A}$, while the switch 304B allows either the input voltage Vin or the low supply voltage Vbot to be coupled to the capacitor $C_{4B}$.

Each of the capacitors $C_{1A}$ to $C_{4A}$ and $C_{1B}$ to $C_{4B}$ is coupled to a node 305, which is in turn coupled to a negative input of the comparator 306. The positive input of comparator 306 is coupled to the reference voltage Vref. The output of comparator 306 is coupled to a 4-bit output register 308. A control block 312 receives the output of the 4-bit register 308, and based on the values stored in this register, determines the switching of switches 301A to 303A and 301B to 303B.

In this embodiment, the reference voltage Vref preferably equals the supply voltage Vs. Operation of the converter 300 of FIG. 3 will now be described in more detail with reference to the flow diagram of FIG. 4.

In a first step S0, a sample phase is performed, in which the input voltage Vin is sampled to each of the capacitors $C_{1A}$ to $C_{4A}$ and $C_{1B}$ to $C_{4B}$. In particular, each of the switches 301A to 304A and 301B to 304B is controlled to couple the corresponding capacitor to the input voltage Vin, and the switch 310 is closed, thereby coupling the node 305 to the supply voltage Vs. This configuration is shown by the solid lines in each switch of FIG. 3.

In a next step S1, at the start of a conversion phase, the comparator input at node 305 is isolated from the supply voltage Vs by opening switch 310, and the first capacitor $C_{1A}$ to $C_{4A}$ of each pair of capacitors is coupled to the high supply voltage Vtop, and the second capacitor $C_{1B}$ to $C_{4B}$ of each pair of capacitors is coupled to the low supply voltage Vbot. This configuration is illustrated in FIG. 3 by a dash line in each switch. The effect of coupling one capacitor of each pair to the high supply voltage Vtop and the other capacitor of each pair to the low supply voltage Vbot is to apply the same voltage at node 305 as would have been applied if a single capacitor were coupled to the voltage Vc. For example, assuming that Vtop is equal to 0.5 V, Vbot is equal to 0 V, and that the capacitors $C_{1A}$ and $C_{1B}$ have equal capacitance, the effect will be the same as imposing a voltage Vc of 0.25 V to capacitor $C_1$ of FIG. 1.

In particular, it can be shown that:

$$Va = Vs + (Vtop - Vin)/2 - (Vin - Vbot)/2 = Vs + (Vtop + Vbot)/2 - Vin$$

Given that (Vtop+Vbot)/2 is equal to Vc, this is equivalent to Vs+Vc−Vin.

Figure 4:
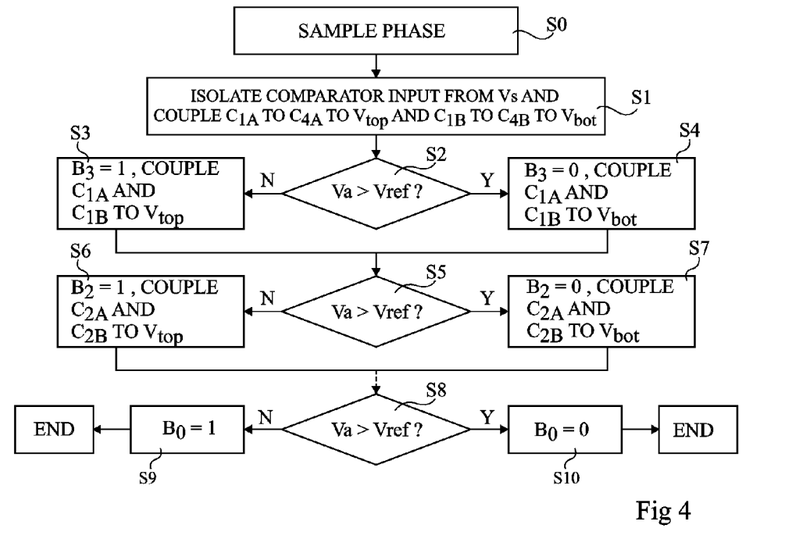
FIG. 4 is a flow diagram illustrating steps in a method for performing analog to digital conversion based on the circuitry of FIG. 3 according to an embodiment.

In a next step S2, it is determined whether the voltage Va at node 305 coupled to the negative input of comparator 306 is greater than the reference voltage Vref at the positive input of comparator 306.

If it is determined in S2 that Va is less than Vref, then the next step is S3, in which the MSB B3 of the 4-bit output is set to "1", and switch 301B is controlled to couple capacitor $C_{1B}$ to Vtop, such that both capacitors $C_{1A}$ and $C_{1B}$ are coupled to Vtop.

Alternatively, if it is determined in S2 that Va is greater than Vref, then the next step is S4, in which the MSB B3 of the 4-bit output is set to "0", and switch 301A is controlled to couple capacitor $C_{1A}$ to Vbot, such that both capacitors $C_{1A}$ and $C_{1B}$ are coupled to Vbot.

After steps S3 and S4, the next step is S5, in which again the voltage Va at the negative input of comparator 306 is compared to the reference voltage Vref, based on the new connection of capacitors $C_{1A}$ and $C_{1B}$.

If it is determined in S5 that Va is less than Vref, then the next step is S6, in which the bit $B_2$ is set to "1", and switch 302B is controlled to couple capacitor $C_{2B}$ to Vtop, such that both capacitors $C_{2A}$ and $C_{2B}$ are coupled to Vtop.

Alternatively, if it is determined in S5 that Va is greater than Vref, then the next step is S7, in which the bit $B_2$ is set to "0", and capacitor $C_{2A}$ is coupled to Vbot, such that both capacitors $C_{2A}$ and $C_{2B}$ are coupled to Vbot.

After steps S6 and S7, the method continues by comparing again Va and Vref based on the new connections of capacitors $C_{2A}$ and $C_{2B}$, but for the sake of brevity these steps and the subsequent switching step of capacitor $C_{3A}$ or $C_{3B}$ are not illustrated in FIG. 4. Instead, the method goes straight to step S8, in which each of capacitors $C_{3A}$ and $C_{3B}$ has been connected to either Vtop or Vbot.

In step S8, the least significant bit $B_0$ of the digital output value is determined, based on a comparison of Va and Vref.

If in S8 it is determined that Va is less than Vref, the next step is S9, in which $B_0$ is set to "1".

Alternatively, if it is determined in S8 that Va is greater than Vref, the next step is S10, in which $B_0$ is set equal to "0".

As with the embodiment of FIG. 1, the capacitors $C_{4A}$ and $C_{4B}$ remain coupled respectively to Vtop and Vbot throughout the conversion process, and could be omitted in alternative embodiments.

While the embodiment of FIG. 3 is a 4-bit converter, it will be apparent to those skilled that a N-bit converter, with N for example a value in the range 2 to 32, could be implemented using fewer or more capacitors.

Figure 5:
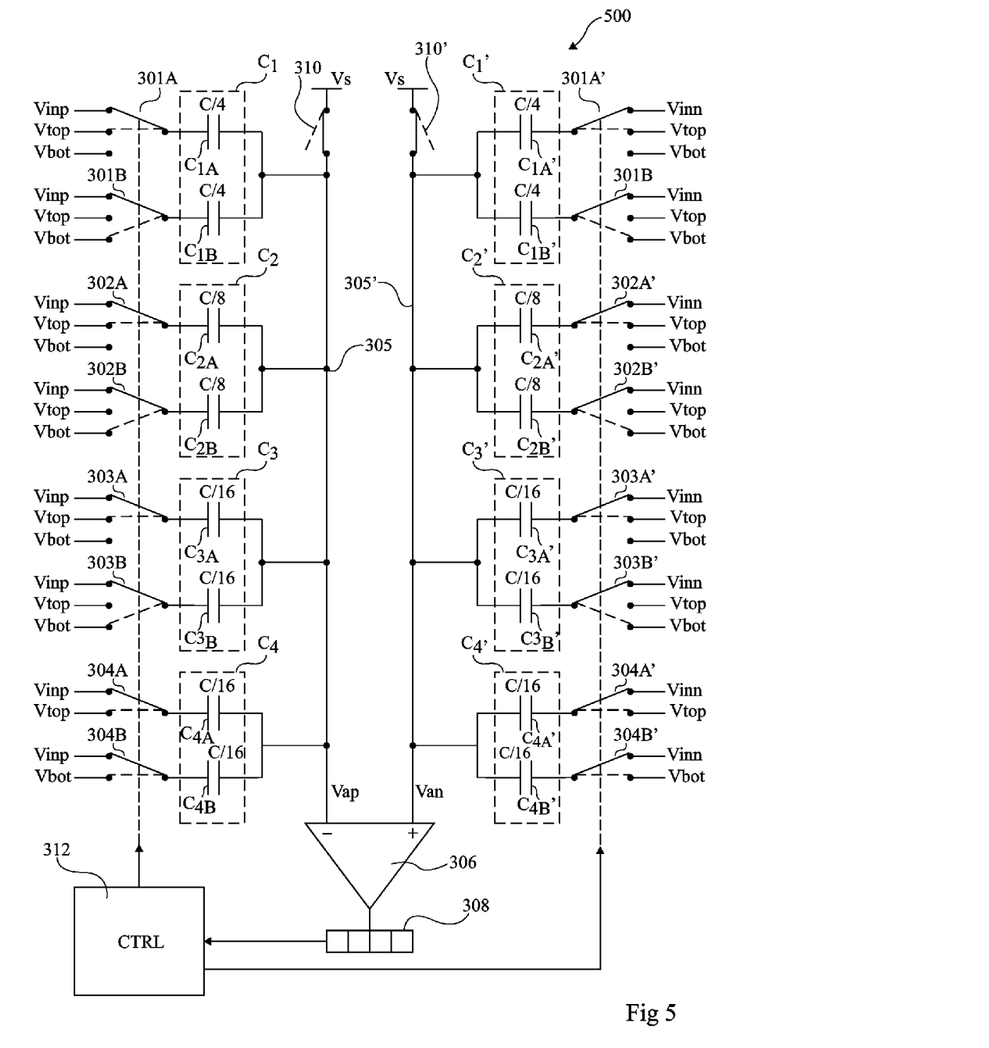
FIG. 5 illustrates a differential SAR ADC according to an embodiment.

FIG. 5 illustrates a SAR ADC 500 similar to the one of FIG. 3, but adapted to a differential implementation. In particular, the left-hand side of converter 300 is the same as the circuitry coupled to the negative input of the comparator 306 in FIG. 3. On the right-hand side, each of the capacitors $C_1'$, $C_2$, $C_3'$ and $C_4'$ of FIG. 1 is split into a corresponding pair of capacitors $C_{1A}'$ and $C_{1B}'$, $C_{2A}'$ and $C_{2B}'$, $C_{3A}'$ and $C_{3B}'$, $C_{4A}'$ and $C_{4B}'$.

Operation of the differential converter 500 is similar to that of the single-ended implementation for which the operation flow is shown in FIG. 4. However, during the sample phase S0, a positive component Vinp of the input signal is coupled to the pairs of capacitors of the left-hand side of the converter, and a negative component Vinn of the input signal is coupled to the pairs of capacitors of the right-hand side of the converter. Then, in S1 at the start of the conversion phase, the capacitors $C_{1A}'$ to $C_{4A}'$ are coupled to Vtop and capacitors $C_{1B}'$ to $C_{4B}'$ are coupled to Vbot. Then, in step S3 of FIG. 4 capacitor $C_{1A}'$ will be coupled to Vbot, in step S4 of FIG. 4 capacitor $C_{1B}'$ will be coupled to Vtop, in step S6 of FIG. 4 capacitor $C_{2A}'$ will be coupled to Vbot, and in step S7 of FIG. 4, the capacitor $C_{2B}'$ will be coupled to Vtop.

While in the embodiment of FIG. 5 each of the capacitors $C_1$ to $C_4$ and $C_1'$ to $C_4'$ comprises a pair of capacitors each having 50% of the overall capacitance of the pair, different ratios can be used between the capacitors of one or more of the pairs of capacitors, such as 40/60, 30/70 or 20/80. In the case that the ratio is not 50/50, at the start of the conversion phase, the larger capacitor on the left-hand side of the converter should be coupled to the same supply voltage as the larger capacitor on the right-hand side of the converter and similarly the smaller capacitors coupled to the same opposite supply voltage. For example, assuming that the ratio of capacitors $C_{1A}/C_{1B}$ is 70/30, and the ratio of capacitors $C_{1A}'/C_{1B}'$ is also 70/30, at the start of the conversion phase both capacitors $C_{1A}$ and $C_{1A}'$ are for example coupled to Vtop, and both capacitors $C_{1B}$ and $C_{1B}'$ are for example coupled to Vbot.

Figure 6:
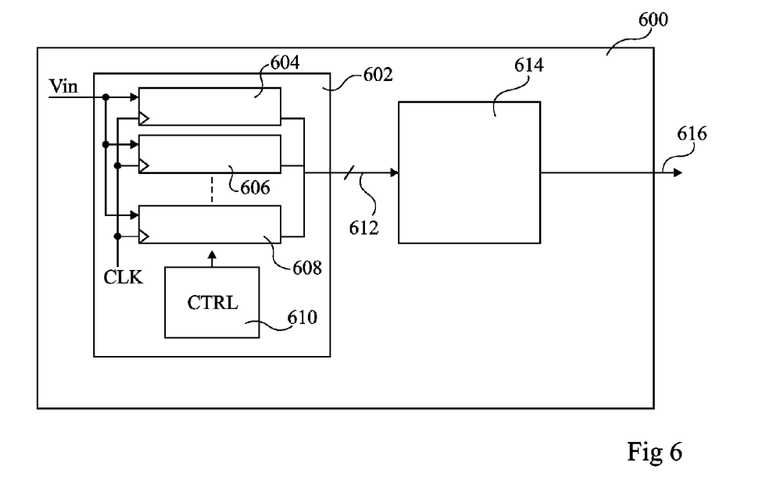
FIG. 6 illustrates an electronic device comprising an analog to digital conversion unit according to embodiments.

FIG. 6 illustrates an electronic device 600 comprising a SAR ADC conversion unit 602, which comprises a number of converters 604, 606 and 608, each for example corresponding to the converter 300 of FIG. 3, or 500 of FIG. 5 based on a single-ended or differential implementation. As represented by dash lines between the converters 606 and 608, the conversion unit 602 may comprise more than three converters.

The converters 604 to 608 are coupled in parallel, and controlled by a timing signal CLK. Each converter receives the input voltage Vin, which may be single-ended or differential, and provides an output digital value, based on the output of each converter. In particular, the outputs of each of the converters 604 to 608 are offset in the time domain with respect to each other, to provide a high sampling rate of the input signal, and high output bit rate.

A control block 610 is for example used for controlling the switches of each of the converters 604 to 608.

The conversion unit 602 converts the input signal Vin into a n-bit digital value, where n is for example equal to between 2 and 32. The output binary signals are provided by an output line 612 to a block 614, which is for example a processor and/or a memory device for processing or storing the digital values. The block 614 for example generates an output signal 616.

The device 600 is for example a mobile communications device, PDA (Personal Digital Assistant), digital media player, lap-top computer or other digital electronic devices.

An advantage of the embodiments described herein is that, by splitting each capacitor of the SAR ADC converter into two capacitors, the advantages of providing an intermediate voltage Vc can be obtained without generating externally this additional supply voltage level, and thereby reducing the area overhead and complexity when compared to the embodiment of FIG. 1.

A further advantage of the embodiments described herein when compared to the embodiment of FIG. 1 is that the 4-way switches 101 to 104 and 101' to 104' are replaced by 3-way switches, due to the removal of the Vc input. This greatly reduces the complexity of each switch.

An advantage of the differential embodiment is that the capacitors of each capacitor pair are not limited to having equal capacitance, thereby facilitating the matching of these capacitors.

Having thus described at least one illustrative embodiment of the invention, various alterations, modifications and improvements will readily occur to those skilled in the art.

For example, while the embodiments have been described in relation to 4-bit converters, the same principles can be equally applied to any n-bit converter, for example with n between 2 and 32.

Furthermore, while in the described embodiments the capacitors of the capacitor arrays have a binary weighting, alternatively they could have different weightings, for example if a non-linear quantization is to be applied.

Furthermore, while in the embodiment of FIG. 3 the input voltage has been represented as being applied by switches 301A to 304A and 301B to 304B, it will be apparent to those skilled in the art that alternatively the supply voltage Vs could be applied via these switches, and the differential input voltage could be applied via switch 310. Similarly, in the embodiment of FIG. 5, the differential input signal could be applied to the capacitors via switches 310 and 310'.

The variations features described in relation to the various embodiments could be combined in alternative embodiments in any combination.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of successive approximation analog to digital conversion comprising:
   during a sample phase, coupling an input signal to first terminals of a plurality of pairs of capacitors, second terminals of first and second capacitors of each pair being coupled to a first input of a comparator; and
   during a conversion phase, coupling the first terminal of a first capacitor of each pair to a first supply voltage, and the first terminal of a second capacitor of each pair to a second supply voltage.

2. The method of claim 1, wherein the first capacitor of each pair has the same capacitance as the second capacitor of each pair.

3. The method of claim 1, wherein the first and second capacitors of at least one of said pairs have different capacitances from each other.

4. The method of claim 1, the method further comprising, after coupling the first and second capacitors to said first and second supply voltages respectively, comparing by said comparator the voltage at said first input with a further voltage level, and based on said comparison either coupling the first capacitor of a first of said pairs to said second supply voltage, or coupling the second capacitor of the first of said pairs of capacitors to said first supply voltage.

5. The method of claim 4, wherein said further voltage level is a reference voltage level.

6. The method of claim 4, wherein said further voltage level is a voltage level generated by a further plurality of pairs of capacitors.

7. The method of claim 6, further comprising:
   during said sample phase, coupling a further input signal to said further plurality of pairs of capacitors; and
   during said conversion phase, coupling a first capacitor of each pair of said further plurality of pairs to said first supply voltage, and coupling a second capacitor of each pair of said further plurality of pairs to said second supply voltage.

8. The method of claim 7, wherein said first and second capacitors of each further pair are coupled to a second input of a comparator, the method comprising, based on said comparison, coupling the first capacitor of a first of said pairs to said second supply voltage and a second capacitor of a first of said further pairs to said first supply voltage, or coupling the second capacitor of the first of said pairs to said first supply voltage and the first capacitor of the first of said further pairs to said second supply voltage.

9. The method of claim 8, wherein said first capacitor of said first of said pairs has a larger capacitance than said second capacitor of said first of said pairs of capacitors, and said first capacitor of the first of said further pairs is has a larger capacitance than said second capacitor) of said first of said further pairs of capacitors.

10. The method of claim 1, wherein during said sampling phase, said input signal is applied to a first terminal of each of said plurality of pairs of capacitors, and a third supply voltage is applied to a second terminal of each of said plurality of pairs.

11. A successive approximation analog to digital converter comprising:
 a comparator;
 a plurality of pairs of capacitors, each capacitor of the plurality of pairs being coupled between a corresponding switch and a first input terminal of the comparator, and each having a first terminal arranged to receive an input voltage during a sample phase of the converter; and
 control circuitry arranged to control, at the start of a conversion phase of said converter, said switches such that the first terminal of a first capacitor of each pair is coupled to a first supply voltage, and the first terminal of a second capacitor of each of said pairs is coupled to a second supply voltage.

12. The successive approximation analog to digital converter of claim 10, further comprising:
 a further plurality of pairs of capacitors each coupled between a corresponding switch and a further input terminal of the comparator, and each further pair being arranged to receive a further input voltage during said sample phase;
 wherein said control circuitry is further arranged to control, at the start of said conversion phase of said converter, said switches such that a first capacitor of each pair is coupled to a first supply voltage, and a second capacitor of each of said pairs is coupled to a second supply voltage.

13. The successive approximation analog to digital converter of claim 11, wherein said first capacitor of at least one of said pairs has a different capacitance to said second capacitor of said at least one pair.

14. An electronic device comprising a plurality of the successive approximation analog to digital converters of claim 11 arranged in parallel to convert an input voltage.

15. A successive approximation analog to digital converter comprising:
 a comparator;
 a first plurality of pairs of capacitors;
 a first plurality of pairs of switches, each capacitor of the first plurality of pairs having a first terminal coupled to a corresponding switch of the first plurality of pairs and a second terminal coupled to a first input of the comparator; and
 a controller configured to control the switches of the first plurality of pairs such that, during a sample phase, a first input signal is coupled to the first terminal of each capacitor of the first plurality of pairs and to control the switches of the first plurality of pairs such that, at a start of a conversion phase, a first supply voltage is coupled to the first terminal of a first capacitor of each pair of the first plurality of pairs and a second supply voltage is coupled to the first terminal of a second capacitor of each pair of the first plurality of pairs.

16. A successive approximation analog to digital converter as defined in claim 15, wherein the first capacitor and the second capacitor of each pair of the first plurality of pairs have equal capacitance values.

17. A successive approximation analog to digital converter as defined in claim 15, further comprising an additional switch coupled between the first input of the comparator and a third supply voltage, wherein the controller is configured to control the additional switch such that, during the sample phase, the first input of the comparator is coupled to the third supply voltage and such that, during the conversion phase, the first input of the comparator is isolated from the third supply voltage.

18. A successive approximation analog to digital converter as defined in claim 15, wherein a second input of the comparator is coupled to a reference voltage level.

19. A successive approximation analog to digital converter as defined in claim 15, further comprising a second plurality of pairs of capacitors and a second plurality of pairs of switches, each capacitor of the second plurality of pairs having a first terminal coupled to a corresponding switch of the second plurality of pairs and a second terminal coupled to a second input of the comparator, wherein the controller is configured to control the switches of the second plurality of pairs such that, during the sample phase, a second input signal is coupled to the first terminal of each capacitor of the second plurality of pairs and to control the switches of the second plurality of pairs such that at the start of the conversion phase, the first supply voltage is coupled to the first terminal of a first capacitor of each pair of the second plurality of pairs and the second supply voltage is coupled to the first terminal of a second capacitor of each pair of the second plurality of pairs.

20. A successive approximation analog to digital converter as defined in claim 15, wherein the comparator is configured, after the first and second capacitors are coupled to the first and second supply voltages, respectively, to compare a voltage at the first input of the comparator with a reference voltage level and wherein the controller is further configured, based on a result of the comparison, to couple the first capacitor of a first pair of the first plurality of pairs to the second supply voltage or to couple the second capacitor of the first pair of the first plurality of pairs to the first supply voltage.

21. A method of successive approximation analog to digital conversion, comprising:
 during a sample phase, coupling a first input signal to a first terminal of each capacitor of a first plurality of pairs of capacitors; and
 at a start of a conversion phase,
  coupling a first supply voltage to the first terminal of a first capacitor of each pair of the first plurality of pairs, and
  coupling a second supply voltage to the first terminal of a second capacitor of each pair of the first plurality of pairs,
 wherein a second terminal of each capacitor of the first plurality of pairs is coupled to a first input of a comparator.

22. A method of successive approximation analog to digital conversion as defined in claims 21, wherein the first capacitor and the second capacitor of each pair of the first plurality of pairs have equal capacitance values.

23. A method of successive approximation analog to digital conversion as defined in claim 21, further comprising coupling the first input of the comparator to a third supply voltage during the sample phase and isolating the first input of the comparator from the third supply voltage during the conversion phase.

24. A method of successive approximation analog to digital conversion as defined in claim 21, further comprising coupling a second input of the comparator to a reference voltage level.

25. A method of successive approximation analog to digital conversion as defined in claim 21, further comprising:
    during the sample phase, coupling a second input signal to a first terminal of each capacitor of a second plurality of pairs of capacitors; and
    at the start of the conversion phase, coupling the first supply voltage to the first terminal of a first capacitor of each pair of the second plurality of pairs, and coupling the second supply voltage to the first terminal of a second capacitor of each pair of the second plurality of pairs, wherein a second terminal of each capacitor of the second plurality of pairs is coupled to a second input of the comparator.

26. A method of successive approximation analog to digital conversion as defined in claim 21, further comprising, after coupling the first and second capacitors to the first and second supply voltages, respectively, comparing, by the comparator, a voltage at the first input of the comparator with a reference voltage level, and, based on a result of the comparison, either coupling the first capacitor of a first pair of the first plurality of pairs to the second supply voltage or coupling the second capacitor of the first pair of the first plurality of pairs to the first supply voltage.

* * * * *